(12) United States Patent
Choi

(10) Patent No.: US 6,198,688 B1
(45) Date of Patent: Mar. 6, 2001

(54) INTERFACE FOR SYNCHRONOUS SEMICONDUCTOR MEMORIES

(75) Inventor: J. S. Choi, Kyungki-do (KR)

(73) Assignee: Hyundai Electronics Industries, Co., Ltd. (KR)

( * ) Notice: Subject to any disclaimer, the term of this patent is extended or adjusted under 35 U.S.C. 154(b) by 0 days.

(21) Appl. No.: 09/282,275

(22) Filed: Mar. 31, 1999

Related U.S. Application Data

(60) Provisional application No. 60/080,443, filed on Apr. 2, 1998.
(51) Int. Cl.[7] ....................................... G11C 8/00
(52) U.S. Cl. ............................. 365/233; 365/51; 365/63
(58) Field of Search ............................. 365/233, 51, 63

(56) References Cited

U.S. PATENT DOCUMENTS

| | | | |
|---|---|---|---|
| 5,812,490 | * 9/1998 | Tsukude | 365/233 |
| 5,880,998 | * 3/1999 | Tanimura et al. | 365/189.05 |
| 5,886,948 | * 3/1999 | Ryan | 365/233 |
| 6,064,625 | * 5/2000 | Tomita | 365/233 |

* cited by examiner

Primary Examiner—Richard Elms
Assistant Examiner—Tuan T. Nguyen
(74) Attorney, Agent, or Firm—Babak S. Sani; Townsend and Townsed and Crew LLP

(57) ABSTRACT

Various techniques and novel architectures for synchronous memories that improve the overall speed and bandwidth of the memory circuit. In one embodiment, two independent clock pins are provided to help improve the data window and memory bandwidth. Other embodiments offer pin-out structures for synchronous memories that make the memory device less susceptible to noise and cross-talk, and provide for byte-controllable scheme for more flexible processing of data in memory systems.

25 Claims, 7 Drawing Sheets

FIG. 5A
(PRIOR ART)

| Pin | | Pin | |
|---|---|---|---|
| VDD | 1 | 54 | VSS |
| DQ0 | 2 | 53 | DQ15 |
| VDDQ | 3 | 52 | VSSQ |
| DQ1 | 4 | 51 | DQ14 |
| DQ2 | 5 | 50 | DQ13 |
| VSSQ | 6 | 49 | VDDQ |
| DQ3 | 7 | 48 | DQ12 |
| DQ4 | 8 | 47 | DQ11 |
| VDDQ | 9 | 46 | VSSQ |
| DQ5 | 10 | 45 | DQ10 |
| DQ6 | 11 | 44 | DQ9 |
| VSSQ | 12 | 43 | VDDQ |
| DQ7 | 13 | 42 | DQ8 |
| VDD | 14 | 41 | VSS |
| LDQM | 15 | 40 | VREF |
| /WE | 16 | 39 | UDQM |
| /CAS | 17 | 38 | CLK |
| /RAS | 18 | 37 | CKE |
| /CS | 19 | 36 | QS |
| A13(BA0) | 20 | 35 | A11 |
| A12(BA1) | 21 | 34 | A9 |
| A10/AP | 22 | 33 | A8 |
| A0 | 23 | 32 | A7 |
| A1 | 24 | 31 | A6 |
| A2 | 25 | 30 | A5 |
| A3 | 26 | 29 | A4 |
| VDD | 27 | 28 | VSS |

(SDRAM)

FIG. 5B

| | | | | |
|---|---|---|---|---|
| VDD | 1 | | 58 | VSS |
| DQ0 | 2 | | 57 | DQ15 |
| VDDQ | 3 | | 56 | VSSQ |
| DQ1 | 4 | | 55 | DQ14 |
| DQ2 | 5 | | 54 | DQ13 |
| VSSQ | 6 | | 53 | VDDQ |
| DQ3 | 7 | | 52 | DQ12 |
| DQ4 | 8 | | 51 | DQ11 |
| VDDQ | 9 | | 50 | VSSQ |
| DQ5 | 10 | | 49 | DQ10 |
| DQ6 | 11 | | 48 | DQ9 |
| VSSQ | 12 | | 47 | VDDQ |
| DQ7 | 13 | SDRAM | 46 | DQ8 |
| NC | 14 | | 45 | DQS |
| VDD | 15 | | 44 | VSS |
| QSM | 16 | | 43 | VREF |
| LDQM | 17 | | 42 | UDQM |
| /WE | 18 | | 41 | /CLK |
| /CAS | 19 | | 40 | CLK |
| /RAS | 20 | | 39 | |
| /CS | 21 | | 38 | NC |
| A13(BA0) | 22 | | 37 | A11 |
| A12(BA1) | 23 | | 36 | A9 |
| A10/AP | 24 | | 35 | A8 |
| A0 | 25 | | 34 | A7 |
| A1 | 26 | | 33 | A6 |
| A2 | 27 | | 32 | A5 |
| A3 | 28 | | 31 | A4 |
| VDD | 29 | | 30 | VSS |

FIG. 6

| | | | | |
|---|---|---|---|---|
| VDD | 1 | | 66 | VSS |
| DQ0 | 2 | | 65 | DQ15 |
| VDDQ | 3 | | 64 | VSSQ |
| DQ1 | 4 | | 63 | DQ14 |
| DQ2 | 5 | | 62 | DQ13 |
| VSSQ | 6 | | 61 | VDDQ |
| DQ3 | 7 | | 60 | DQ12 |
| DQ4 | 8 | | 59 | DQ11 |
| VDDQ | 9 | | 58 | VSSQ |
| DQ5 | 10 | | 57 | DQ10 |
| DQ6 | 11 | | 56 | DQ9 |
| VSSQ | 12 | | 55 | VDDQ |
| DQ7 | 13 | SDRAM | 54 | DQ8 |
| NC | 14 | | 53 | NC |
| VDDQ | 15 | | 52 | VSSQ |
| LQS | 16 | | 51 | UQS |
| NC | 17 | | 50 | NC |
| VDD | 18 | | 49 | VSS |
| NC | 19 | | 48 | VREF |
| LDM | 20 | | 47 | UDM |
| /WE | 21 | | 46 | /CLK |
| /CAS | 22 | | 45 | CLK |
| /RAS | 23 | | 44 | CKE |
| /CS | 24 | | 43 | NC |
| NC | 25 | | 42 | NC |
| BA0 | 26 | | 41 | A11 |
| BA1 | 27 | | 40 | A9 |
| A10/AP | 28 | | 39 | A8 |
| A0 | 29 | | 38 | A7 |
| A1 | 30 | | 37 | A6 |
| A2 | 31 | | 36 | A5 |
| A3 | 32 | | 35 | A4 |
| VDD | 33 | | 34 | VSS |

INTERFACE FOR SYNCHRONOUS SEMICONDUCTOR MEMORIES

STATEMENT OF RELATED APPLICATIONS

This patent application claims priority from U.S. Provisional Application No. 60/080,443, filed Apr. 2, 1998. The contents of the provisional application are herein incorporated by reference.

BACKGROUND OF THE INVENTION

The present invention relates in general to semiconductor memories and in particular to an in improved interface and pin-out for synchronous semiconductor memories.

To improve the speed of memory circuits such as dynamic random access memories (DRAMs), a new generation of memory circuits has been developed that operates in response to a system clock. The system clock enables the memory circuit to operate synchronously with the associated controller. Thus, every read and write operation is synchronized with one edge, usually the rising edge, of the system clock. Referring to FIG. 1, there is shown a simplified block diagram of a prior art system using a single clock synchronous memory device 100. A clock driver or generator 102 generates a clock signal CLK and supplies CLK to memory device 100. A controller 104 connects to both memory device 100 and clock driver 102. In existing systems, clock driver 102 is typically required to guarantee only the timing of the rising edge of the clock signal CLK which triggers the various operations of the system. There may be as much as 15% variation in the failing edge of CLK, resulting in a clock signal that does not have a 50% duty cycle. This is tolerable since all system activity is synchronized to the rising edge of CLK. FIG. 2 is a timing diagram illustrating a read operation of the prior art single clock memory device. As shown, both the read command and the data outputs occur at rising edges of CLK signal while the falling edge which exhibits variations in its timing is essentially ignored. Therefore, given for example a CLK signal with a 10 ns period, the 15% variation in the falling edge leaves only about a 3.5 ns window for data processing.

The synchronous operation of the memory has improved the speed and bandwidth of the memory circuit by allowing the use of circuit techniques such as pipelining. However, given current microprocessors that operate much faster than the associated DRAMs, there is always a demand for faster memory chips with greater bandwidth.

SUMMARY OF THE INVENTION

The present invention provides various techniques and novel architectures for clocking synchronous memories that improve the overall speed and bandwidth of the memory circuit. Broadly, in one embodiment, the present invention provides a synchronous memory circuit that receives, and operates in response to, two clock signals that are complementary in nature. The provision of two clock pins that receive complementary clock signals as opposed to one results in a wider window of time for the memory circuit and the associated controller to process data and thus increases data bandwidth and signal integrity.

Another aspect of the present invention modifies the package pin-out for the synchronous memory circuit, moving a data strobe pin away from noisy pins, such as the pin receiving the clock signal, and closer to data pins. Further, the present invention provides a byte controllable data strobe scheme. According to this embodiment of the present invention, instead of a single data strobe signal, the memory circuit receives two or more strobe signals each dedicated to a selected sub-group of the data terminals.

Accordingly, in one embodiment, the present invention provides a semiconductor memory circuit including a first clock terminal coupled to receive a first periodic clock signal, a second clock terminal coupled to receive a second periodic clock signal, a first clock circuit coupled to the first clock terminal and configured to generate a first narrow pulse at one edge of the first clock signal; and a second clock circuit coupled to the second clock terminal and configured to generate a second narrow pulse at one edge of the second clock signal, wherein, a window of time for processing one data bit is defined by the temporal distance between the first narrow pulse and the second narrow pulse. In a more specific embodiment, the first periodic clock signal and the second periodic clock signal are complementary with respect to each other. Further, the first clock circuit generates the first narrow pulse on every rising edge of the first clock signal, and the second clock circuit generates the second narrow pulse on every rising edge of the second clock signal.

In another embodiment, the present invention provides a semiconductor memory device including a plurality of external pins adapted to interface with external circuitry, the plurality of external pins includes a plurality of data pins coupled to carry memory data, a clock pin coupled to carry a clock signal, a data strobe pin coupled to carry a data strobe signal, and a plurality of power pins, wherein the data strobe pin is located adjacent to a data pin and away from the clock pin. In a specific embodiment, the data strobe pin is located directly between a power pin and a data pin.

In yet another embodiment, the present invention provides a semiconductor memory device including a plurality of data pins coupled to carry memory data and divided into a first group and a second group, a first data strobe pin coupled to carry a first data strobe signal in response to which memory data on said first group of data pins is strobed, and a second data strobe pin coupled to carry a second data strobe signal in response to which memory data on said second group of data pins is strobed.

A better understanding of the nature and advantages of the present invention may be gained with reference to the detailed description and the drawings below.

BRIEF DESCRIPTION OF THE DRAWINGS

FIGS. 5A and 5B show a prior art package pin-out for the synchronous memory device, and an exemplary embodiment of a package pin-out for the synchronous memory device according to the present invention, respectively; and FIG. 6 shows another exemplary embodiment of a package pin-out for the synchronous memory device according to the present invention.

DESCRIPTION OF THE SPECIFIC EMBODIMENTS

Figure 1:
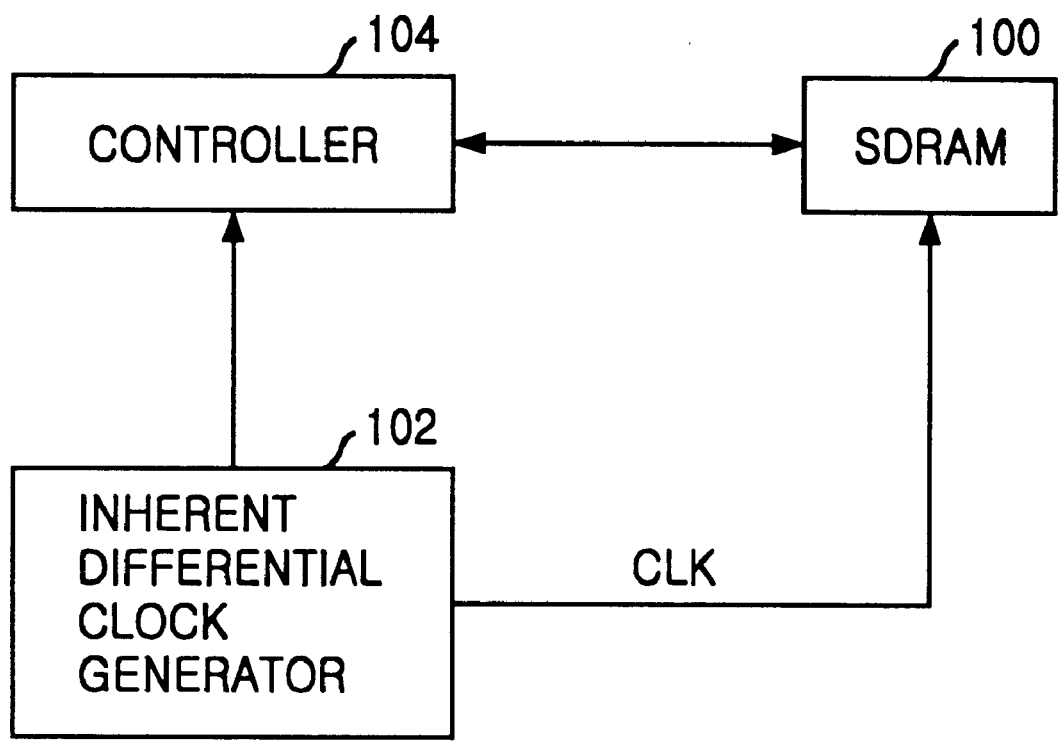
FIG. 1 is a simplified block diagram of a prior art system using a single clock synchronous memory device.
Figure 2:
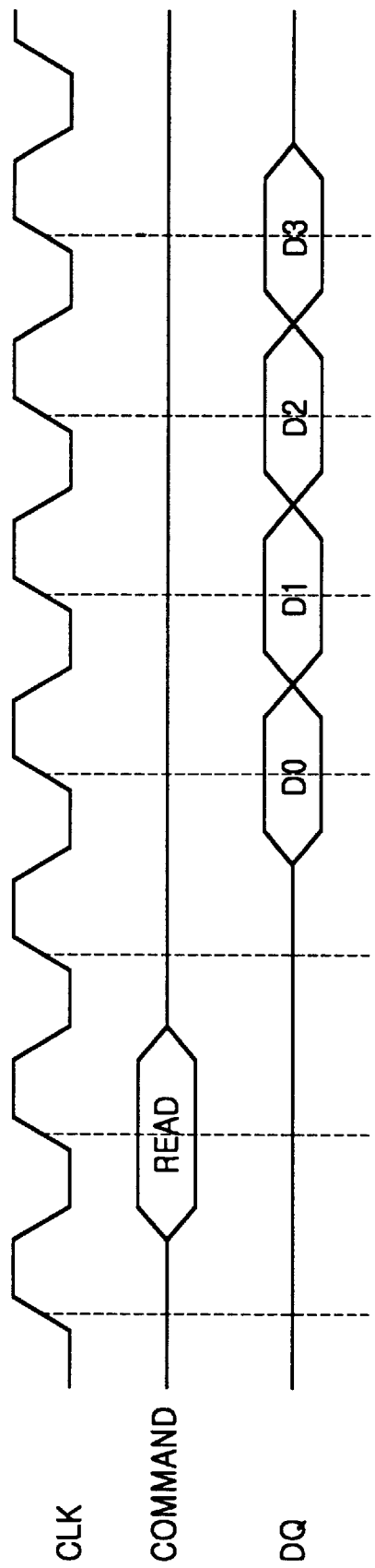
FIG. 2 is a timing diagram illustrating a read operation of the prior art single clock synchronous memory device.

The first generation of synchronous memory devices such as the synchronous DRAM (SDRAM), operates similar to the system shown in FIG. 1 in terms of the clocking scheme. The next generation of such synchronous memory devices utilize both edges of the clock signal allowing the device to double its data rate. The so-called double data rate (DDR) SDRAM has offered appreciable speed enhancements by utilizing both edges of the clock in processing memory data. There is generally a strong demand in the memory industry to maintain downward compatibility with each new generation of products. For example, DRAM manufacturers and suppliers in general tend as much as possible to keep the same pin locations on packages for each new generation of DRAMs to allow existing sockets on boards to receive the new parts. While this approach is economical and offers obvious advantages, the present invention departs from this approach and offers a different architecture that better serves the functionality of the high speed clocked memory devices such as the DDR SDRAM.

Figure 3:
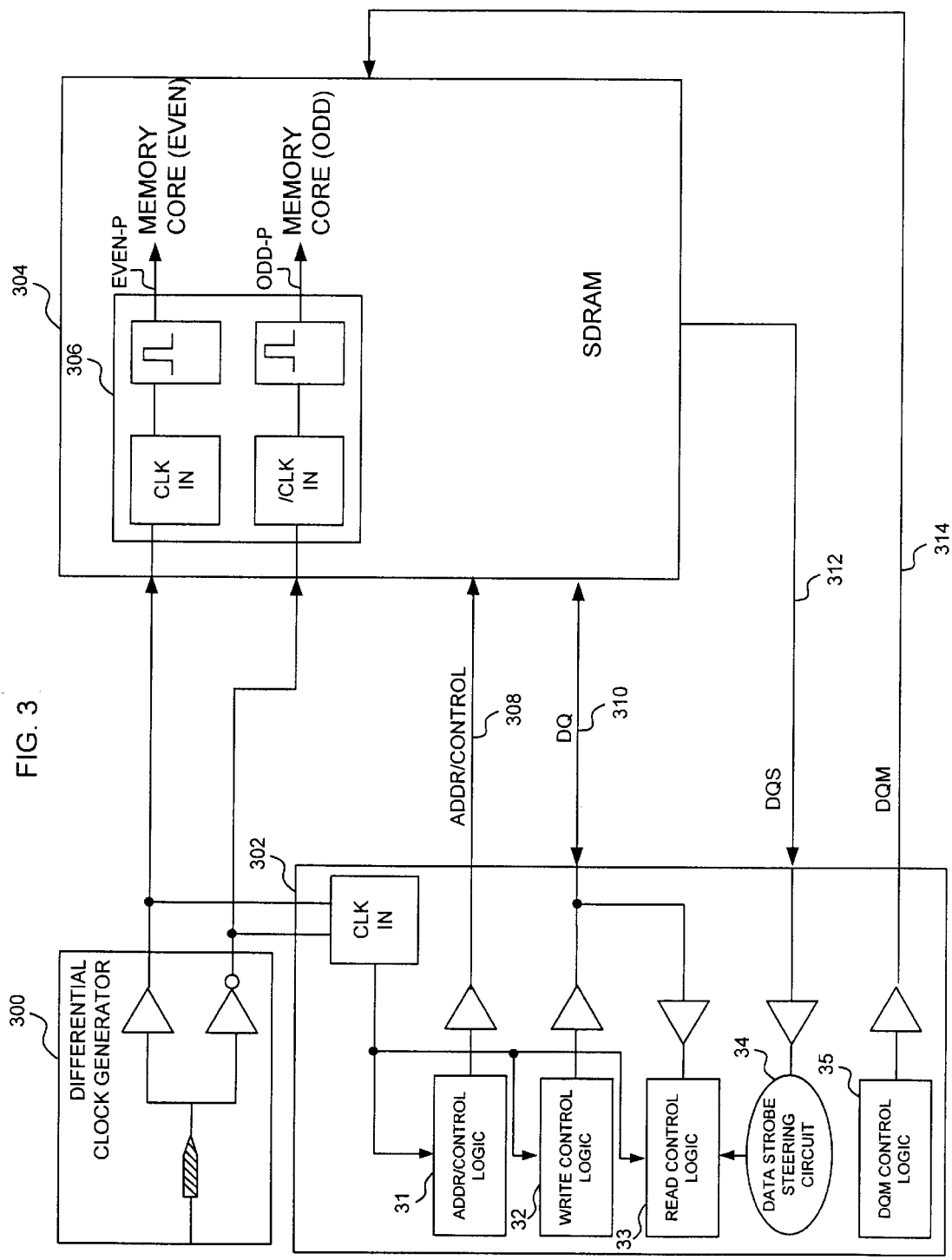
FIG. 3 is a block diagram of a system utilizing the synchronous memory device of the present invention.

Referring to FIG. 3, there is shown a block diagram of the system utilizing the synchronous memory device according to one embodiment of the present invention. The present invention is particularly well suited for the DDR SDRAM and is described in the context of the SDRAM. It is to be understood, however, that the use of the SDRAM is for illustrative purposes only and that the present invention is applicable to memory devices other than the DDR SDRAM, such as the synchronous graphics DRAM (SGRAM). The system of FIG. 3 includes a differential clock driver or generator 300 that generates complementary clock signals CLK and /CLK from a clock signal CLOCK that is supplied by controller 302. Signals CLK and /CLK connect to two input terminals of synch memory device 304. Internal clock circuitry 306 inside synch memory device 304 generates narrow pulses on one, e.g., the rising, edges of signals CLK and /CLK. The resulting signals EVEN_P and ODD_P run even and odd memory core circuitry, respectively.

The interface between synch. memory device 304 and controller 302 includes an address/control bus 308 that carries memory address and control information generated by address/control logic unit 31 inside controller 302. A bidirectional data bus DQ 310 carries memory data between synch. memory device 304 and write and read control logic 32 and 33 inside controller 302. A data strobe bus DQS 312 carries the data strobe signal DQS from synch. memory device 304 to a data strobe steering circuit 34 inside controller 302. A data mask bus DQM 314 carries data mask information DQM from DQM control logic 35 inside controller 302 to SDRAM 306.

Figure 4:
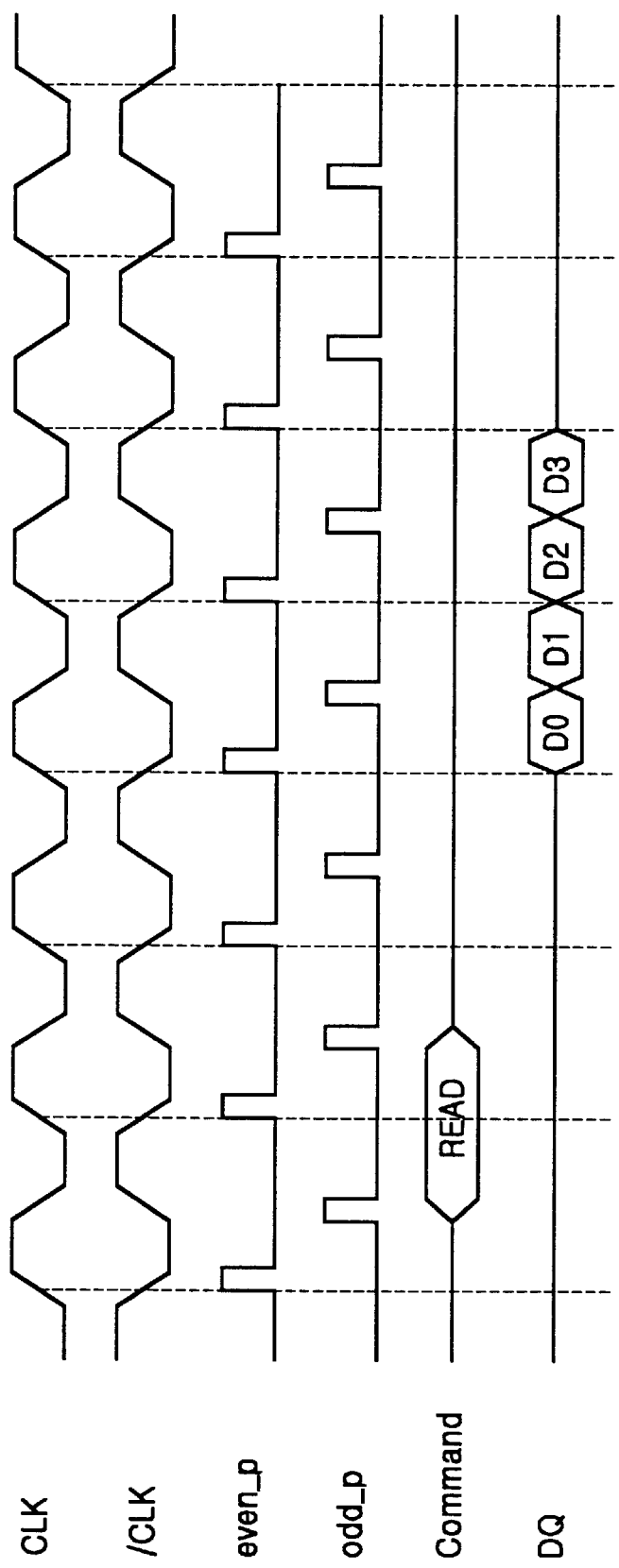
FIG. 4 is a timing diagram illustrating the operation of the double clock synchronous memory circuit of the present invention in a read mode.

FIG. 4 is a timing diagram illustrating the operation of the synch. memory device in a read mode with a latency of 2. Narrow pulses EVEN_P and ODD_P are generated at the rising edges of CLK and /CLK, respectively. A read command occurs at the rising edge of CLK and read data is generated two clock cycles later (i.e., latency =2) with data being output at every rising edge of both CLK and /CLK signals. Clock generator 300 generates signals CLK and /CLK each exhibiting minimized jitter in their rising edges. With, for example, a limited 5% variation in the rising edge of CLK and /CLK, and a 10 ns clock period, a larger data window of 4.5 ns is made available to the memory and the controller. Thus, the present invention increases the data window and provides more time for the controller and the memory to process data. This makes the circuitry easier to design and improves signal integrity. Signal integrity is improved because the larger data window reduces the impact of noise caused by, for example, overshoot and undershoot conditions.

Memory device 304 of FIG. 3 thus requires two clock pins to receive the external clock signals CLK and /CLK. As mentioned above, with the current generation of SDRAMs that have one clock pin, the requirement of two clock pins departs from the prior art approach of maintaining downward compatibility. FIG. 5A illustrates a prior art SDRAM that is downward compatible and requires only one clock pin, pin 38. FIG. 5B is an exemplary embodiment of a 58 pin SDRAM package according to the present invention that includes two clock pins to receive CLK (at pin 40) and /CLK (at pin 41). While a SDRAM according to the present invention would not be downward compatible, it offers the advantages of higher data throughput and greater bandwidth, improved signal integrity and reduced design complexity.

Another feature of the present invention that provides an improvement over the prior art pin-out structure, relates to the data strobe signal DQS. Later generations of SDRAMs have introduced a data strobe signal for purposes of data alignment during read and write operations. This has added a data strobe pin DQS which toggles at the same time that the read data transitions, and write data is strobed in. Referring back to FIG. 5A, the prior art places DQS at pin 36 which is near clock related signals CLK (pin 38) and CKE (pin 37). This arrangement has a number of disadvantages. By its nature, the high frequency clock signal introduces more noise into its neighboring environment, adversely affecting the quality of the DQS signal. Being away from the data pins also gives rise to potential skew in the timing of the DQS transitions with respect to that of the read or write data. It is critical that DQS toggle at exactly the same time that the output data transitions. Any such skew is therefore highly undesirable. Further, DQS and data pins are typically bussed together as a group externally (i.e., on the system board). Having clock pin (or other pins) in between the data pins and DQS often results in buses having to cross over each other on the board. This increases the likelihood of undesirable crosstalk noise. To eliminate all of these drawbacks, the present invention moves the data strobe DQS pin away from the noisy clock related pins, and places it closer to data pins. In the exemplary embodiment shown in FIG. 5B, DQS (pin 45) is located between VSS (pin 44) and DQ8 (pin 46). Once again, this departs from the prior art practice of maintaining downward compatibility, but the result significantly improves the integrity of the DQS signal.

Yet another aspect of the present invention that improves the performance of synchronous memories is the use of more than one data strobe signals. Referring to FIG. 6, there is shown another exemplary embodiment of a package pin-out for a 66 pin synchronous memory device according to the present invention. This pin-out also includes two clock pins CLK pin 45 and /CLK pin 45, but instead of a single data strobe pin DSQ, it provides two separate data strobe pins UQS pin 51 and LQS pin 16. This embodiment provides separate strobe signals for two bytes of data. That is, the upper byte of data DQ8 through DQ 15 are controlled by upper strobe signal UQS, and the lower byte of data DQO through DQ7 are controlled by lower strobe signal LQS. This arrangement has advantages in memory systems with a wide data bus capable of processing data in, e.g., 8-bit wide bytes. That is, in certain memory systems, the data bus may carry individual bytes that are valid at different times. Thus, it would be desirable to allow the system of to separately process and manipulate bytes of data on the data bus. A single DQS signal permits processing of a single group of data at a time, two DQS signals allow simultaneous processing of two bytes of data, etc. In this fashion, the present invention provides a byte-controllable data strobe scheme.

According to the exemplary embodiment of the present invention shown in FIG. 6, the synchronous memory device operates with two data strobe pins UQS and LQS. The two data strobe pins (16 and 51) are preferably located closer to data pins and away from noisy clock pins. In the embodiment if FIG. 6, UQS is assigned to pin 51 which is located between a power pin (VSSQ pin 52) and a no-connect pin 50, while LQS is assigned to pin 16 which is located between a power pin (VDDQ pin 15) and a no-connect pin 17. Note that in this embodiment as well, the data strobe pins are located away from the clock pins and closer to the data pins. It is to be understood that byte-controllability as taught by the present invention is not limited to two data strobe pins for independent controlling of two bytes of data, and that depending on the application and the size of the memory, multiple data strobe signals can be provided for independent processing of a larger number bytes of data. Furthermore, having separate data strobe pins allows for embodiments wherein complementary DQS signals can be supplied to the memory device to increase the accuracy of data alignment. A complementary pair of DQS signals can be used internally by the memory device to generate internal strobe signals that significantly reduce the effect of jitter and duty cycle variations. This embodiment, however, does not permit byte-controllability unless more than one pair of data strobe signals are provided.

In conclusion, the present invention provides various techniques for improving the performance of synchronous memory devices and systems. In one embodiment, the provision of two clock pins helps improve the data window and bandwidth. Another embodiment, offers a pin-out structure that makes the memory device less susceptible to noise and cross-talk, and in yet another embodiment, the present invention provides a byte-controllable scheme for processing data in memory systems. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A semiconductor memory device comprising:
    a first clock terminal coupled to receive a first periodic clock signal;
    a second clock terminal coupled to receive a second periodic clock signal;
    a first clock circuit coupled to the first clock terminal and configured to generate a first narrow pulse at one edge of the first periodic clock signal; and
    a second clock circuit coupled to the second clock terminal and configured to generate a second narrow pulse at one edge of the second periodic clock signal,
        wherein, during a read or write mode of operation, the first narrow pulse triggers processing of a first bit of data and the second narrow pulse triggers processing of a second bit of memory data.

2. The semiconductor memory device of claim 1 wherein the first periodic clock signal and the second periodic clock signal are complementary with respect to each other.

3. The semiconductor memory device of claim 2 wherein the first clock circuit generates the first narrow pulse on every rising edge of the first clock signal, and the second clock circuit generates the second narrow pulse on every rising edge of the second clock signal.

4. The semiconductor memory device of claim 3 wherein the memory circuit comprises a synchronous random access memory circuit.

5. The semiconductor memory device of claim 4 wherein the memory circuit comprises a synchronous dynamic random access memory circuit.

6. The semiconductor memory device of claim 1 further comprising a first data strobe terminal coupled to carry a first data strobe signal that aligns read and write data during read and write operations, the first data strobe terminal being located adjacent to a power terminal and not adjacent to any clock related terminals.

7. A memory system comprising:
    a clock driver having circuitry configured to generate a first periodic clock signal and a second periodic clock signal that is complementary to the first periodic clock signal;
    a memory controller having a clock terminal coupled to the clock driver, and including circuitry configured to control flow of memory data and memory control signals; and
    a synchronous memory device coupled to the clock driver and the memory controller, the synchronous memory device comprising:
        a first clock terminal coupled to receive the first periodic clock signal;
        a second clock terminal coupled to receive the second periodic clock signal;
        a first clock circuit coupled to the first clock terminal and configured to generate a first narrow pulse at one edge of the first periodic clock signal; and
        a second clock circuit coupled to the second clock terminal and configured to generate a second narrow pulse at one edge of the second periodic clock signal, wherein, a window of time for processing one data bit is defined by the temporal distance between the first narrow pulse and the second narrow pulse.

8. The memory system of claim 7 wherein the memory controller couples to the synchronous memory device via an interface, the interface having an address/control bus, and a data bus.

9. The memory system of claim 8 wherein the interface further comprises a data strobe bus, and a data mask bus.

10. The memory system of claim 9 wherein the memory controller comprises:
    address/control logic coupled to the address/control bus;
    read and write control logic coupled to the data bus;
    data strobe steering circuit coupled to the data strobe bus; and
    data mask control logic coupled to the data mask bus.

11. The memory system of claim 9 wherein the memory device further comprises:
    a plurality of address terminals respectively coupled to the address/control bus;
    a plurality of data terminals respectively coupled to the data bus; and
    a first data strobe terminal coupled to carry a first data strobe signal.

12. The memory system of claim 11 wherein the memory device further includes a second data strobe terminal coupled to carry a second data strobe signal, wherein the first data strobe signal strobes a first group of data carried by a first group of interconnects in the data bus, and the second strobe signal strobes a second group of data carried by a second group of interconnects in the data bus.

13. The memory system of claim 12 wherein the first group of data comprises an upper half of data forming an upper byte, and the second group of data comprises a lower half of data forming a lower byte.

14. The memory system of claim 11 wherein the first strobe terminal is located adjacent to a power terminal and not adjacent to any clock related terminals.

15. The memory system of claim 14 wherein the first strobe terminal is positioned such that no clock terminal is located between the first strobe terminal and a data terminal.

16. The semiconductor memory device of claim 1 further comprising a first data strobe terminal coupled to carry a first data strobe signal that aligns read and write data during read and write operations, the first data strobe terminal being located adjacent to a power terminal and not adjacent to any clock related terminals.

17. The semiconductor memory device of claim 1 further comprising a first data strobe terminal coupled to carry a first data strobe signal that aligns read and write data during read and write operations, the first data strobe terminal being positioned such that no clock terminal is located between the first strobe terminal and a data terminal.

18. The semiconductor memory device of claim 17 further comprising a second data strobe terminal coupled to carry a second data strobe signal.

19. A semiconductor memory device having a pin-out structure comprising:
   a plurality of data pins coupled to carry memory data;
   a plurality of address pins coupled to carry memory address;
   a clock pin coupled to carry a periodic clock signal and configured to synchronize the operation of the memory device; and
   a first data strobe pin coupled to carry a first data strobe signal that aligns read and write data in read and write mode of operations, respectively,
      wherein, the first data strobe pin is positioned such that the clock pin is not located between the first data strobe pin and a data pin.

20. The semiconductor memory device of claim 19 wherein the pin-out structure further comprises a plurality of power pins, and wherein the first data strobe pin is located adjacent to a power pin.

21. The semiconductor memory device of claim 19 wherein the pin-out structure further comprises a second data strobe pin coupled to carry a second data strobe signal.

22. The semiconductor memory device of claim 21 wherein a first half of the plurality of data pins and the first data strobe pin are located on a first side of the device, and a second half of the plurality of data pins and the second data strobe pin are located on a second side of the device.

23. The semiconductor memory device of claim 22 wherein data on the first half of the data pins is strobed in response to the first data strobe signal, and data on the second half of the data pins is strobed in response to the second strobe signal.

24. A method of operating a synchronous memory device comprising the steps of:
   receiving at a first clock terminal an externally supplied first periodic clock signal;
   receiving at a second clock terminal an externally supplied second periodic clock signal, the second periodic clock signal being a complement of the first periodic clock signal;
   generating a first series of consecutive narrow pulses at respective consecutive rising edges of the first periodic clock signal;
   generating a second series of consecutive narrow pulses at respective consecutive rising edges of the second periodic clock signal; and
   consecutively processing a plurality of bits of memory data in response to the first and second series of consecutive narrow pulses in an alternate fashion, wherein each narrow pulse in each of the first and second series triggers the processing of one bit of memory data.

25. The method of claim 24 wherein the step of consecutively processing comprises the steps of:
   applying a read command to the synchronous memory device;
   performing a read operation; and
   supplying a plurality of bits of read data to a data terminal consecutively, wherein each bit of the plurality of bits of read data occurs at a respective narrow pulse from the first and the second series in an alternate fashion.

* * * * *